(12) United States Patent
Lim et al.

(10) Patent No.: US 8,916,830 B2
(45) Date of Patent: Dec. 23, 2014

(54) X-RAY DETECTOR PANEL

(75) Inventors: James Lim, Yongin (KR); Kwan-Wook Jung, Yongin (KR); Dong-Hyuk Kim, Yongin (KR); Jea-Eun Ryu, Yongin (KR)

(73) Assignee: Samsung Display Co., Ltd., Giheung-Gu, Yongin, Gyeonggi-Do (KR)

( * ) Notice: Subject to any disclaimer, the term of this patent is extended or adjusted under 35 U.S.C. 154(b) by 692 days.

(21) Appl. No.: 13/175,097

(22) Filed: Jul. 1, 2011

(65) Prior Publication Data

US 2012/0061578 A1  Mar. 15, 2012

(30) Foreign Application Priority Data

Sep. 13, 2010 (KR) .................. 10-2010-0089458

(51) Int. Cl.
*H01L 27/146* (2006.01)
*G01T 1/20* (2006.01)
*G01T 1/24* (2006.01)
*G01T 1/29* (2006.01)

(52) U.S. Cl.
CPC ........ *G01T 1/2928* (2013.01); *H01L 27/14663* (2013.01); *H01L 27/14692* (2013.01)
USPC ............. 250/370.09; 250/370.11; 250/370.14

(58) Field of Classification Search
USPC ............................ 250/370.09, 370.11, 370.14
See application file for complete search history.

(56) References Cited

U.S. PATENT DOCUMENTS

| | | | | |
|---|---|---|---|---|
| 5,138,401 | A * | 8/1992 | Yamazaki | 505/191 |
| 7,800,162 | B2 * | 9/2010 | Lee et al. | 257/321 |
| 2003/0201396 | A1 * | 10/2003 | Lee | 250/370.09 |
| 2008/0237474 | A1 * | 10/2008 | Tonotani et al. | 250/363.01 |
| 2009/0108209 | A1 * | 4/2009 | Jung et al. | 250/370.11 |
| 2009/0152563 | A1 * | 6/2009 | Hayashi et al. | 257/72 |
| 2009/0236496 | A1 | 9/2009 | Tanada et al. | |
| 2012/0018627 | A1 * | 1/2012 | Tredwell et al. | 250/252.1 |

FOREIGN PATENT DOCUMENTS

| | | |
|---|---|---|
| KR | 10-2008-0102488 | 11/2008 |
| KR | 10-2008-0108642 | 12/2008 |
| KR | 10-0956338 | 4/2010 |

* cited by examiner

*Primary Examiner* — David Porta
*Assistant Examiner* — Mindy Vu
(74) *Attorney, Agent, or Firm* — Robert E. Bushnell, Esq.

(57) ABSTRACT

An X-ray detector panel comprises: a substrate; a transistor including a gate electrode disposed on the substrate, a gate insulating layer disposed on the gate electrode, an active layer disposed on the gate insulating layer, and a source electrode and a drain electrode disposed on the active layer and separated from each other; a photodiode including a first electrode connected to the drain electrode of the transistor, a photoconductive layer disposed on the first electrode, and a second electrode disposed on the photoconductive layer; an interlayer insulating layer including a first interlayer insulating layer covering the transistor and the photodiode, the first interlayer insulating layer being formed of an insulating material having a band gap energy of about 8 eV to about 10 eV; a data line disposed on the interlayer insulating layer and contacting the source electrode of the transistor via the interlayer insulating layer; a bias line disposed on the interlayer insulating layer and contacting the second electrode of the photodiode via the interlayer insulating layer; and a passivation layer disposed on the data line, the bias line, and the interlayer insulating layer.

18 Claims, 6 Drawing Sheets

X-RAY DETECTOR PANEL

CLAIM OF PRIORITY

This application makes reference to, incorporates the same herein, and claims all benefits accruing under 35 U.S.C. §119 from an application earlier filed in the Korean Intellectual Property Office on the 13$^{th}$ of Sep. 2010 and there duly assigned Serial No. 10-2010-0089458.

BACKGROUND OF THE INVENTION

1. Field of the Invention

The present invention relates to an X-ray detector and, more particularly, to an X-ray detector panel including a thin film transistor (TFT) and a PIN diode.

2. Description of the Related Art

An amount of X-rays, which have wavelengths ranging between those of visible rays and gamma rays, and which may be transmitted through solids, varies according to the densities of the solids. An inside of an object may be imaged by measuring the amount of X-rays transmitted through the object.

Photosensitive films were used for a long time to record X-ray images. However, in X-ray digital radiography (DR), which is recently advancing, X-ray detectors are used to acquire X-ray images.

X-ray detectors may be roughly categorized into either a charge coupled device (CCD) type or a flat panel (FP) type. However, these types are both based on a basic principle in which charges photoelectrically generated in units of pixels are converted into digital signals by an analog-to-digital converter (ADC). However, CCD X-ray detectors may have low efficiency and resolution since CCDs may be not large enough to receive the entire incident light.

FP X-ray detectors may be further divided into a direct type and an indirect type. Direct FP X-ray detectors directly convert quanta of X-rays into charges. Indirect FP X-ray detectors convert X-rays into visible rays first, and then convert the visible rays into charges. In both direct and indirect FP X-ray directors, the charges converted from X-rays or visible rays are transferred to an amplifier and an analog-to-digital converter (ADC) via a thin film transistor (TFT) switching device. Direct FP X-ray detectors do not require additional steps, but are disadvantageous in terms of low X-ray conversion efficiency, high-voltage requirement, short lifespan of a semiconductor layer for converting X-rays into charges, and the like. For these reasons, indirect FP X-ray directors are currently widely used.

An indirect FP X-ray detector includes a scintillator layer and a flat panel under the scintillator layer. The flat panel is an array of pixels, each pixel including a PIN diode and a TFT. In particular, according to the operating principle of direct FP X-ray detectors, X-rays emitted from an X-ray source are transmitted through an object, and are then converted into visible rays in the scintillator layer. The visible rays are then incident onto the PIN diodes of the flat panel so that electrons are generated in the PIN diodes and are read by the TFTs. Signals read from each pixel in such a manner are digitized by an ADC, and are finally realized as digital images on a monitor.

SUMMARY OF THE INVENTION

The present invention provides a reliable X-ray detector panel capable of preventing moisture permeation and suppressing current leakage from a PIN diode.

According to an aspect of the present invention, an X-ray detector panel comprises: a substrate; a transistor including a gate electrode disposed on the substrate, a gate insulating layer disposed on the gate electrode, an active layer disposed on the gate insulating layer, and a source electrode and a drain electrode disposed on the active layer and separated from each other; a photodiode including a first electrode connected to the drain electrode of the transistor, a photoconductive layer disposed on the first electrode, and a second electrode disposed on the photoconductive layer; an interlayer insulating layer including a first interlayer insulating layer covering the transistor and the photodiode, the first interlayer insulating layer being formed of an insulating material having a band gap energy of about 8 eV to about 10 eV; a data line disposed on the interlayer insulating layer and contacting the source electrode of the transistor via the interlayer insulating layer; a bias line disposed on the interlayer insulating layer and contacting the second electrode of the photodiode via the interlayer insulating layer; and a passivation layer disposed on the data line, the bias line, and the interlayer insulating layer.

The interlayer insulating layer may have a thickness of about 6000 Å to about 10 μm. The interlayer insulating layer may further include a second interlayer insulating layer disposed on the first interlayer insulating layer, the second interlayer insulating layer being formed of an insulating material having a band gap energy of about 3 eV to about 10 eV. The first interlayer insulating layer may have a thickness of about 300 Å to about 1000 Å.

The insulating material of the first interlayer insulating layer may include a silicon oxide (SiOx) layer.

The insulating material of the second interlayer insulating layer may include a silicon oxynitride (SiONx) layer.

The passivation layer may include a silicon nitride (SiNx) layer.

The X-ray detector panel may further include a planarization layer disposed on the passivation layer. The X-ray detector panel may further include a scintillator layer disposed on the planarization layer.

The photodiode may include a PIN diode.

The X-ray detector panel may further include an ohmic contact layer disposed between the active layer and each of the source electrode and the drain electrode.

According to another aspect of the present invention, an X-ray detector panel comprises: a substrate; a transistor including a gate electrode disposed on the substrate, a gate insulating layer disposed on the gate electrode, an active layer disposed on the gate insulating layer, and a source electrode and a drain electrode disposed on the active layer and separated from each other; a photodiode including a first layer which includes a lower layer extending from the drain electrode of the transistor, and an upper layer disposed on the lower layer, a photoconductive layer disposed on the upper layer of the first electrode, and a second electrode disposed on the photoconductive layer; a capping layer covering the transistor; an interlayer insulating layer including a first interlayer insulating layer covering the capping layer and the photodiode, the first interlayer insulating layer being formed of an insulating material having a band gap energy of about 8 eV to about 10 eV; a data line disposed on the interlayer insulating layer and contacting the source electrode of the transistor via the interlayer insulating layer and the capping layer; a bias line disposed on the interlayer insulating layer and contacting the second electrode of the photodiode via the interlayer insulating layer; and a passivation layer disposed on the data line, the bias line, and the interlayer insulating layer.

BRIEF DESCRIPTION OF THE DRAWINGS

A more complete appreciation of the invention, and many of the attendant advantages thereof, will be readily apparent as the same becomes better understood by reference to the following detailed description when considered in conjunction with the accompanying drawings, in which like reference symbols indicate the same or similar components, wherein.

DETAILED DESCRIPTION OF THE INVENTION

Figure 1:
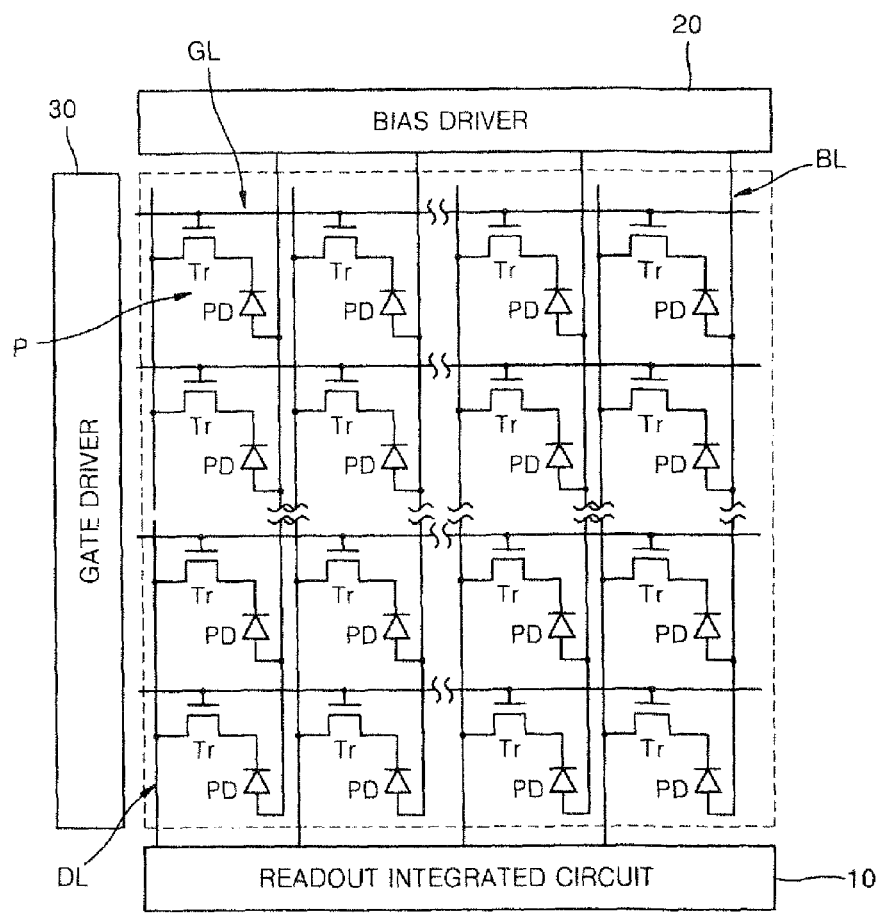
FIG. 1 is a schematic circuit diagram of an X-ray detector panel according to an embodiment of the present invention.

Reference will now be made in detail to exemplary embodiments of the present general inventive concept, examples of which are illustrated in the accompanying drawings. This invention may, however, be embodied in many different forms and should not be construed as limited to the embodiments set forth herein. Rather, these embodiments are provided so that this disclosure will be thorough and complete, and will fully convey the scope of the invention to those of ordinary skill in the art. In the drawings, thicknesses of layers and regions are exaggerated for clarity. Like numbers refer to like elements throughout.

The terms "source electrode" and "drain electrode" used herein are interchangeable.

FIG. 1 is a schematic circuit diagram of an X-ray detector panel according to an embodiment of the present invention.

Referring to FIG. 1, the X-ray detector panel includes a plurality of photosensitive pixels P arranged in a matrix defined by a plurality of gate lines GL and a plurality of data lines DL.

Each of the photosensitive pixels P includes a photodiode (PD) which detects visible light converted in a scintillator layer from X-rays which have been transmitted through an object so as to output an electrical signal, for example, a photodetection voltage, and a transistor Tr which switches the electrical signal outputted from the photodiode PD.

The photodiode PD may be a PIN diode. A first electrode of the photodiode PD is electrically coupled to a drain electrode of the transistor Tr, and a second electrode thereof is electrically coupled to one of a plurality of bias lines BL to which a bias voltage is applied.

A gate electrode of the transistor Tr is electrically coupled to a corresponding gate line GL, and a source electrode thereof is electrically coupled to a readout integrated circuit 10 via a corresponding data line DL.

A bias driver 20 applies a driving voltage to the plurality of bias lines BL. Alternatively, the bias driver 20 may apply a reverse bias or a forward bias to the photodiodes PD.

A gate driver 30 sequentially applies gate signals to the plurality of gate lines GL. If a gate signal is applied to a gate line GL, corresponding transistors Tr are turned on. If a gate signal is not applied to a gate line GL, corresponding transistors Tr are turned off.

If a transistor Tr is turned on, an electrical signal output from a corresponding photodiode PD is outputted to the readout integrated circuit 10 via a corresponding data line DL.

Figure 2:
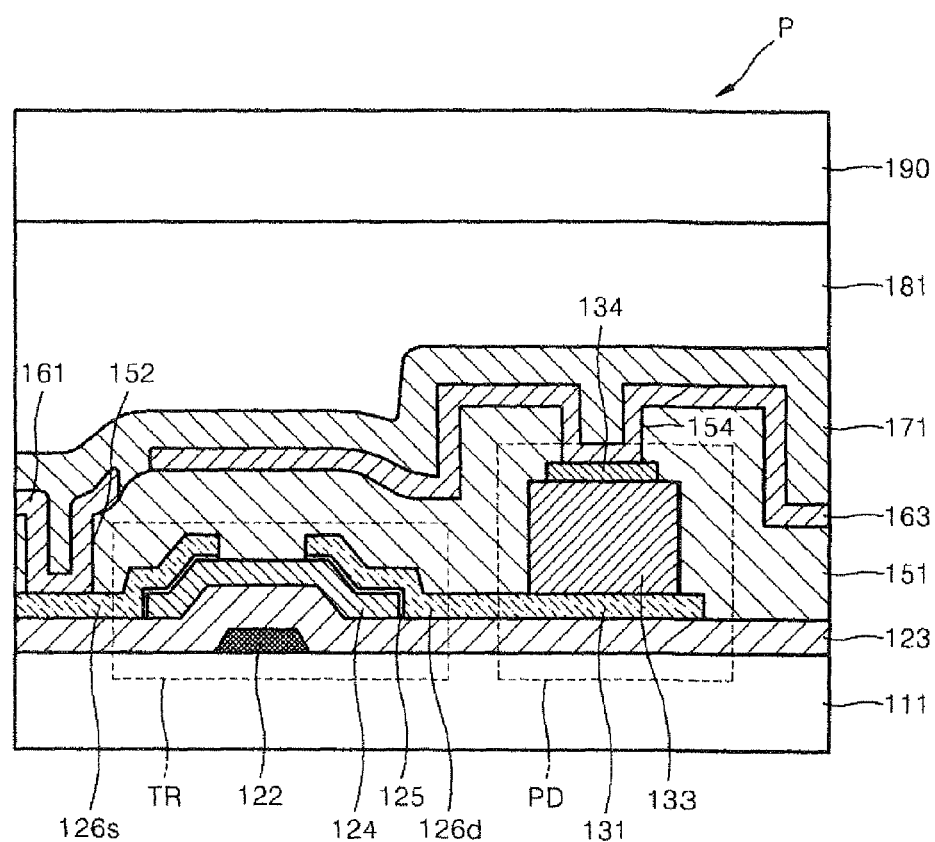
FIG. 2 is a cross-sectional view of a photosensitive pixel of an X-ray detector panel according to an embodiment of the present invention.

FIG. 2 is a cross-sectional view of a photosensitive pixel of an X-ray detector panel according to an embodiment of the present invention.

Referring to FIG. 2, the photosensitive pixel P of the X-ray detector panel includes a transistor TR and a photodiode PD disposed on a base substrate 111. The transistor TR may include a gate electrode 122, an active layer 124, a source electrode 126s, and a drain electrode 126d. The photodiode PD may include a first electrode 131, a photoconductive layer 133, and a second electrode 134.

The base substrate 111 may be formed of a transparent material, for example, glass, quartz, or synthetic resin.

The gate electrode 122 of the transistor TR is disposed on the base substrate 111. The gate electrode 122 may be formed of, for example, aluminum (Al) or an Al alloy. Alternatively, the gate electrode 122 may be formed of a material selected from the group consisting of tungsten (W), molybdenum (Mo), tantalum (Ta), titanium (Ti), copper (Cu), chromium (Cr), cobalt (Co), ruthenium (Ru), niobium (Nb), rhodium (Rh), zirconium (Zr), and alloys thereof.

The gate electrode 122 is covered by a gate insulating layer 123. The gate insulating layer 123 may be formed of, for example, one selected from the group consisting of a silicon nitride (SiNx) layer, a silicon oxide (SiOx) layer, a silicon oxynitride (SiONx) layer, and a combination thereof. Alternatively, the gate insulating layer 123 may be formed of a high-k dielectric layer selected from the group consisting of a hafnium oxide ($HfO_2$) layer, an aluminum oxide ($Al_2O_3$) layer, an yttrium oxide ($Y_2O_3$) layer, a tantalum oxide ($Ta_2O_5$) layer, and a combination thereof.

The active layer 124 for forming a channel is disposed on the gate insulating layer 123. The active layer 124 may be a semiconductor layer formed of, for example, amorphous silicon (a-Si). An ohmic contact layer 125 for forming ohmic contact with the source electrode 126s and the drain electrode 126d may be disposed on the active layer 124. The ohmic contact layer 125 may be formed of heavily-doped amorphous silicon ($n^+$ a-Si or $p^+$ a-Si).

The source electrode 126s and the drain electrode 126d of the transistor TR are disposed on the ohmic contact layer 125. The source electrode 126s and the drain electrode 126d are separated from each other by a predetermined interval. In addition, the source electrode 126s and the drain electrode 126b may be formed of a material selected from the group consisting of W, Mo, Ta, Ti, Cu, Cr, Co, Ru, Nb, Rh, Zr, and alloys thereof, like the gate electrode 122.

The first electrode 131 of the photodiode PD extends on the gate insulating layer 123 from the drain electrode 126d of the transistor TR, and is electrically coupled to the drain electrode 126d. The photoconductive layer 133 of the photodiode PD is disposed on the first electrode 131. Although not illustrated, the photoconductive layer 133 may have a structure in which an n-type silicon layer, an intrinsic silicon layer, and a p-type silicon layer are sequentially stacked on one another. That is to say, the photodiode PD may be a PIN diode.

The second electrode 134 of the photodiode PD is disposed on the photoconductive layer 133 opposite the first electrode 131. The second electrode 134 of the photodiode PD may be formed of a transparent conductive material, for example, indium tin oxide (ITO), indium zinc oxide (IZO), or the like, so as to enable visible rays converted from X-rays to enter the photoconductive layer 133.

An interlayer insulating layer 151 is disposed over an entire surface of the base substrate 111 so as to cover the photodiode PD and the transistor TR. If the interlayer insulating layer 151, which contacts the photodiode PD, is formed of an organic layer, moisture permeating along tiny interfacial cracks between a scintillator layer and the interlayer insulating layer 151 may carry charges to the photodiode PD via the organic layer, thereby causing failure in forming X-ray images. Thus, the interlayer insulating layer 151 may be formed by chemical vapor deposition (CVD) of an inorganic layer having a higher density and better barrier characteristics than organic layers.

For example, the interlayer insulating layer 151 may be formed by CVD of a silicon oxide (SiOx) layer, a silicon oxynitride (SiONx) layer, or a stacked layer thereof. In this regard, the interlayer insulating layer 151 may have a stacked structure, including a silicon oxide layer having a relatively high band gap energy as a lower layer, and a silicon oxynitride layer having a relatively low band gap energy as an upper layer.

Figure 3A:
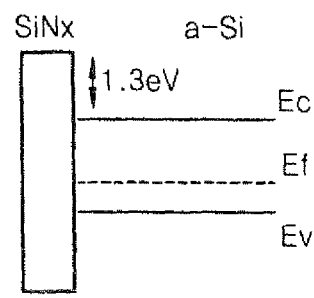
FIG. 3A is an energy band diagram at an interface between a silicon nitride layer and an amorphous silicon.
Figure 3B:
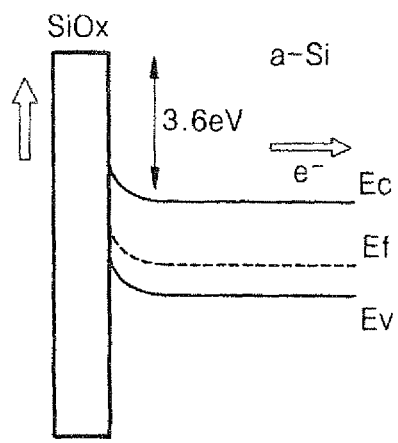
FIG. 3B is an energy band diagram at an interface between a silicon oxide layer and the amorphous silicon.

FIG. 3A is an energy band diagram at an interface between a silicon nitride layer and an amorphous silicon, and FIG. 3B is an energy band diagram at an interface between a silicon oxide layer and the amorphous silicon. The silicon nitride layer has a band gap energy of about 5.4 eV, the silicon oxide layer has a band gap energy of about 9.0 eV, and the amorphous silicon has a band gap energy of about 1.8 eV. The silicon nitride layer has a dielectric constant of about 7 to about 8, the silicon oxynitride layer has a dielectric constant of about 6 to about 8, and the silicon oxide (SiOx) layer has a dielectric constant of about 4. It is understood that the larger a band gap energy of an insulating layer is, the smaller a dielectric constant of the insulating layer is.

Referring to FIGS. 3A and 3B, an energy band of the amorphous silicon appears flat at the interface in contact with the silicon nitride (SiNx) layer, whereas an energy band of the amorphous silicon is curved upward at the interface in contact with the silicon oxide (SiOx) layer. Thus, an accumulation effect of amorphous silicon occurs at the interface in contact with the silicon oxide (SiOx) layer, and therefore electrons may be pushed down into the amorphous silicon from a surface of the amorphous silicon layer. A PIN diode implemented as the photodiode PD includes a p-type silicon layer, an intrinsic silicon layer, and an n-type silicon layer. Thus, when the interlayer insulating layer 151 (FIG. 2), which contacts the PIN diode, is formed of a silicon oxide layer (SiOx), electrons may be less likely to leak from the amorphous silicon of the PIN diode into the silicon oxide (SiOx) layer. Therefore, using a silicon oxide (SiOx) layer having a higher energy band gap than a silicon nitride layer as the interlayer insulating layer 151 is advantageous in preventing a leakage current.

The band gap energy of the silicon oxynitride layer is between those of the silicon nitride layer (SiNx) and the silicon oxide (SiOx) layer, and barrier characteristics of the silicon oxynitride layer also fall between those of the silicon nitride (SiNx) layer and the silicon oxide (SiOx) layer. Thus, the interlayer insulating layer 151 (FIG. 2) may be formed to include a silicon oxide (SiOx) layer as a lower layer which improves leakage current characteristics, and a silicon oxynitride layer as an upper layer which improves barrier characteristics.

Figure 4:
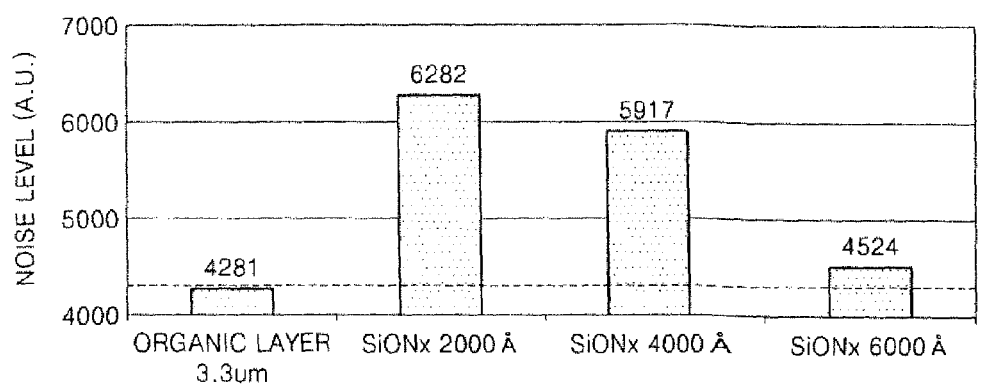
FIG. 4 is a comparative graph showing data line noise levels when interlayer insulating layers are respectively formed of an organic layer and a silicon oxynitride (SiONx) layer having different thicknesses.

FIG. 4 is a comparative graph showing data line noise levels when interlayer insulating layers are respectively formed of an organic layer and a silicon oxynitride (SiONx) layer having different thicknesses.

Specifically, FIG. 4 is a comparative graph showing a data line noise level when the interlayer insulating layer 151 is formed of an organic layer, and data line noise levels when the interlayer insulating layer 151 is formed of a silicon oxynitride (SiONx) layer, with respect to different thicknesses. The data line noise levels are measured by removing pixel driving signals from data line signals.

Referring to FIG. 4, the data line noise level when the interlayer insulating layer 151 is formed of an organic layer having a thickness of about 3.3 μm is the lowest among the data line noise levels shown in the graph. The remaining data line noise levels increase in the order of the interlayer insulating layer 151 formed of a silicon oxynitride (SiONx) layer having a thickness of about 6000 Å, the interlayer insulating layer 151 formed of a silicon oxynitride (SiONx) layer having a thickness of about 4000 Å, and the interlayer insulating layer 151 formed of a silicon oxynitride (SiONx) layer having a thickness of about 2000 Å. That is to say, it is understood that the larger a thickness of a silicon oxynitride (SiONx) layer is, the less a data line noise level is. This matches the fact that the thicker a dielectric insulating layer is, the smaller an electrostatic capacity of a parasitic capacitor between wirings is. Referring to FIG. 4, the data line noise level when the 6000 Å-thick silicon oxynitride (SiONx) layer was used is similar to that when the 3.3 μm-thick organic layer was used, indicating that use of a silicon oxynitride (SiONx) layer thicker than 6000 Å may lead to less data line noise. Thus, if a silicon oxynitride (SiONx) layer is used to form the interlayer insulating layer 151, the thickness of the silicon oxynitride layer may be about 6000 Å or greater. The thickness of the silicon oxynitride (SiONx) layer may be from about 6000 Å to about 10 μm, in consideration of the thickness of a silicon oxynitride (SiONx) layer obtainable by deposition.

Figure 5:
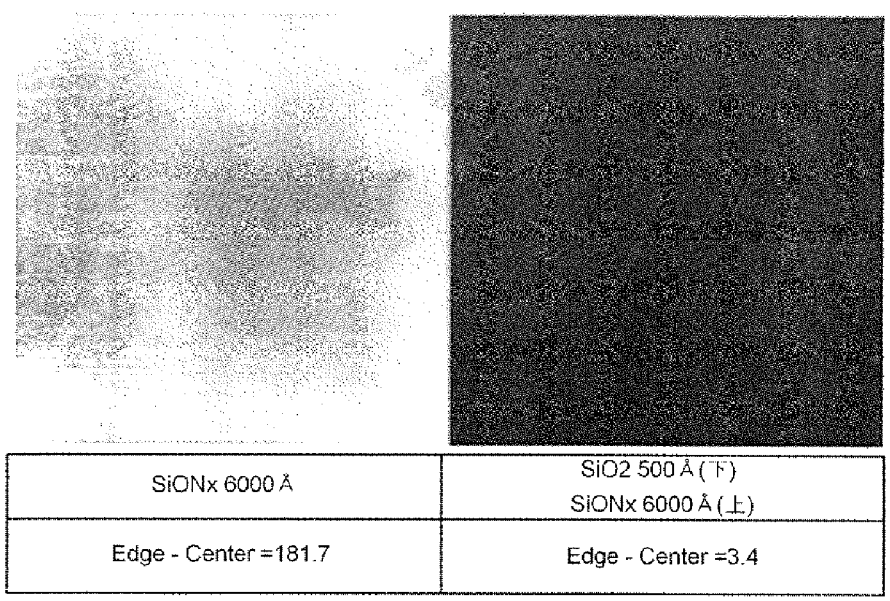
FIG. 5 shows comparative dark images of different interlayer insulating layers respectively formed of a silicon oxynitride (SiONx) layer alone, and a stack layer including a silicon oxide (SiOx) layer and a silicon oxynitride (SiONx) layer.

FIG. 5 shows comparative dark images of different interlayer insulating layers respectively formed of a silicon oxynitride (SiONx) layer alone, and a stack layer including a silicon oxide (SiOx) layer and a silicon oxynitride (SiONx) layer. Referring to FIG. 5, a completely black image was not attainable from the 6000 Å-thick silicon oxynitride (SiONx) layer used as the interlayer insulating layer 151 (FIG. 2). However, a completely black image was obtained from the stack layer including a 500 Å-thick silicon oxide (SiOx) layer and a 6000 Å-thick silicon oxynitride (SiONx) layer stacked on the silicon oxide layer. Thus, it is understood that leakage current is considerably reduced when the silicon oxide (SiOx) layer directly contacts the photodiode PD, as compared to when the silicon oxynitride (SiONx) layer lies directly on the photodiode PD. This matches the conclusion above based on the energy band diagrams of FIGS. 3A and 3B with regard to leakage current.

The silicon oxide (SiOx) layer, which is used along with the silicon oxynitride (SiONx) layer and which directly contacts the photodiode PD, may have a thickness of about 300 Å to about 1000 Å. A total thickness of the silicon oxynitride (SiONx) layer and the silicon oxide (SiOx) layer may be from about 6000 Å to about 10 μm so as to reduce interconnect coupling noise. Alternatively, if a silicon oxide (SiOx) layer is used alone, a thickness of the silicon oxide (SiOx) layer may be from about 6000 Å to about 10 μm.

Referring back to FIG. 2, the interlayer insulating layer 151 includes a first contact hole 152 exposing the source electrode 126s of the transistor Tr, and a second contact hole 154 exposing the second electrode 134 of the photodiode PD. A data line 161 may contact the source electrode 126s of the transistor Tr via the first contact hole 152, and a bias line 163 may contact the second electrode 134 of the photodiode PD via the second contact hole 154.

A passivation layer 171 is disposed over the data line 161, the bias line 163, and the interlayer insulating layer 151. The passivation layer 171 may be formed of a material capable of preventing moisture and impurities from permeating and diffusing through it. For example, the passivation layer 171 may be formed of a silicon nitride (SiNx) layer. The passivation layer 171 may have a thickness of about 6000 Å to about 10 μm. When the thickness of the passivation layer 171 is lower than 6000 Å, permeation and diffusion of moisture and impurities via pin holes may occur. When a thickness of the passivation layer 171 is greater than 10 μm, patterning of the passivation layer 171 may be difficult.

A planarization layer 181 is disposed on the passivation layer 171, and a scintillator layer 190 is disposed on the planarization layer 181. The scintillator layer 190 converts X-rays emitted by an X-ray generator, passed through an object, and incident on the scintillator layer 190 into green light having a visible wavelength of about 550 nm, and transfers the green light to the photodiode PD. The scintillator layer 190 may be formed of, for example, a cesium-iodide compound.

Figure 6:
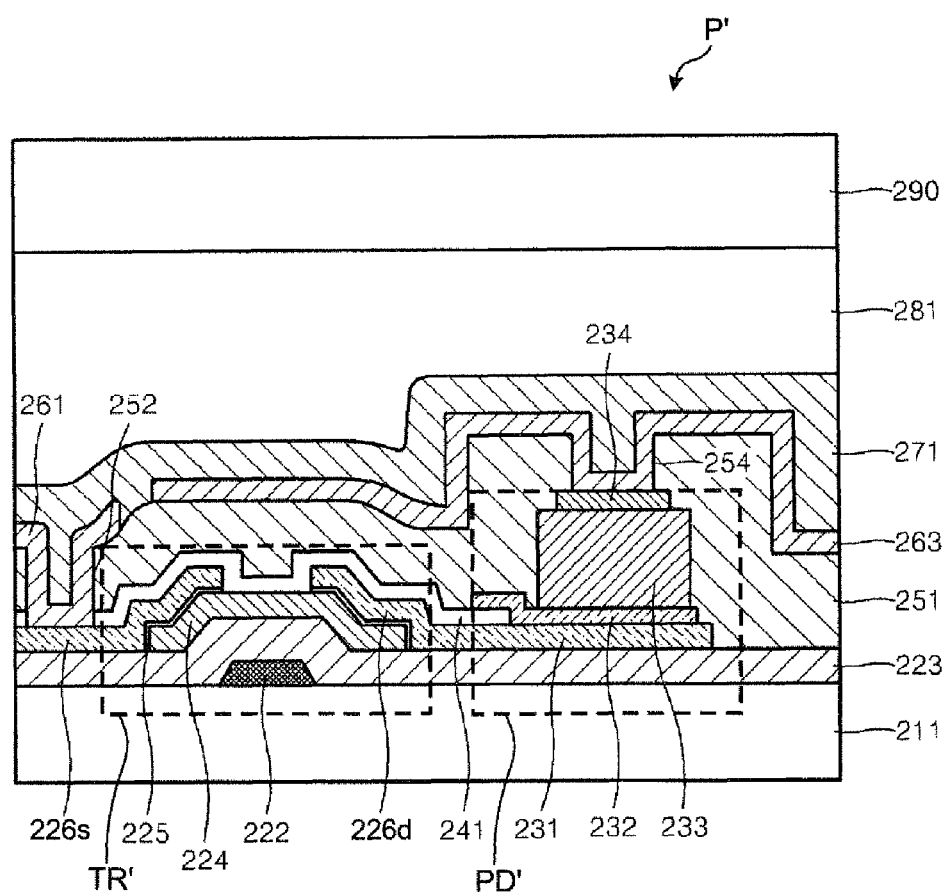
FIG. 6 is a cross-sectional view of a photosensitive pixel of an X-ray detector panel according to another embodiment of the present invention.

FIG. 6 is a cross-sectional view of a photosensitive pixel of an X-ray detector panel according to another embodiment of the present invention. The X-ray detector panel of FIG. 6 according to the current embodiment differs from the X-ray detector panel of FIG. 2 in that the photodiode PD' of FIG. 6 includes a first electrode having an additional electrode element disposed on the first electrode of FIG. 6, and a capping layer 241 is further disposed directly on the source electrode 226s and drain electrode 226d of transistor TR' of FIG. 6.

Referring to FIG. 6, the photosensitive pixel P' of the X-ray detector panel includes the transistor TR' and the photodiode PD' disposed on a base substrate 211. The transistor TR' may include a gate electrode 222, an active layer 224, a source electrode 226s, and a drain electrode 226d. The photodiode PD' may include a lower layer 231 of the first electrode, an upper layer 232 of the first electrode, a photoconductive layer 233, and a second electrode 234.

The base substrate 211 may be formed of a transparent material, for example, glass, quartz, or synthetic resin.

The gate electrode 222 of the transistor TR' is disposed on the base substrate 211. The gate electrode 222 may be formed of, for example, aluminum (Al) or an Al alloy. Alternatively, the gate electrode 222 may be formed of a material selected from the group consisting of W, Mo, Ta, Ti, Cu, Cr, Co, Ru, Nb, Rh, Zr, and alloys thereof.

The gate electrode 222 is covered by a gate insulating layer 223. The gate insulating layer 223 may be formed of, for example, one selected from the group consisting of a silicon nitride (SiNx) layer, a silicon oxide (SiOx) layer, a silicon oxynitride (SiONx) layer, and a combination thereof. Alternatively, the gate insulating layer 223 may be formed of a high-k dielectric layer selected from the group consisting of a hafnium oxide ($HfO_2$) layer, an aluminum oxide ($Al_2O_3$) layer, an yttrium oxide ($Y_2O_3$) layer, a tantalum oxide ($Ta_2O_5$) layer, and a combination thereof.

The active layer 224 for forming a channel is disposed on the gate insulating layer 223. The active layer 224 may be a semiconductor layer formed of, for example, amorphous silicon (a-Si). An ohmic contact layer 225 for forming ohmic contact with the source electrode 226s and the drain electrode 226d may be disposed on the active layer 224. The ohmic contact layer 225 may be formed of heavily-doped amorphous silicon ($n^+$ a-Si or $p^+$ a-Si).

The source electrode 226s and the drain electrode 226d of the transistor TR' are disposed on the ohmic contact layer 225. The source electrode 226s and the drain electrode 226d are separated from each other by a predetermined interval. Likewise the gate electrode 222, the source electrode 226s, and the drain electrode 226d may be formed of a material selected from the group consisting of W, Mo, Ta, Ti, Cu, Cr, Co, Ru, Nb, Rh, Zr, and alloys thereof.

The capping layer 241 is disposed so as to cover the drain electrode 226d, the active layer 224, and the source electrode 226s of the transistor TR'. The capping layer 241 may be formed of a silicon oxide (SiOx) layer, a silicon nitride (SiNx) layer, or a silicon oxynitride (SiONx) layer. The capping layer 241 protects the transistor TR' and blocks an interfacial leakage current. The capping layer 241 may have a thickness of about 0.4 um to about 3 um.

The lower layer 231 of the first electrode of the photodiode PD' extends on the gate insulating layer 223 from the drain electrode 226d of the transistor TR', and is electrically coupled to the drain electrode 226d. An upper layer 232 of the first electrode of the photodiode PD' is disposed on the lower layer 231 of the first electrode and on a portion or region of the capping layer 241. The upper layer 232 of the first electrode of the photodiode PD' may be formed of a metal, for example, Cr, Mo, or Al. The first electrode of the photodiode PD' having such a stack structure may effectively protect the transistor TR' during etching of the photoconductive layer 233 into a pattern. The photoconductive layer 233 of the photodiode PD' is disposed on the upper layer 232 of the first electrode. Although not illustrated, the photoconductive layer 233 may have a structure in which an n-type silicon layer, an intrinsic silicon layer, and a p-type silicon layer are sequentially stacked on one another. That is to say, the photodiode PD' may be a PIN diode.

The second electrode 234 of the photodiode PD' is disposed on the photoconductive layer 234 opposite to the lower layer 231 of the first electrode. The second electrode 234 of the photodiode PD' may be formed of a transparent conductive material, for example, indium tin oxide (ITO), indium zinc oxide (IZO), or the like, so as to enable visible rays converted from X-rays to enter the photoconductive layer 233.

An interlayer insulating layer 251 is disposed over an entire surface of the base substrate 211, covering the photodiode PD' and the transistor TR'. The interlayer insulating layer 251 may be formed of a silicon oxide (SiOx) layer, or a stacked layer including a silicon oxide (SiOx) layer and a silicon oxynitride (SiONx) layer. For example, the interlayer insulating layer 251 may have a stacked structure including a silicon oxide layer having a relatively large band gap energy and a relatively small dielectric constant as a lower layer, and a silicon oxynitride (SiONx) layer having a relatively small band gap energy and a relatively large dielectric constant as an upper layer. The interlayer insulating layer 251 may have a thickness of about 6000 Å to about 10 μm.

The interlayer insulating layer 251 includes a first contact hole 252 exposing the source electrode 226s of the transistor TR', and a second contact hole 254 exposing the second electrode 234 of the photodiode PD'. A data line 261 may contact the source electrode 226s of the transistor TR' via the first contact hole 252, and a bias line 263 may contact the second electrode 234 of the photodiode PD' via the second contact hole 254.

A passivation layer 271 is disposed over the data line 261, the bias line 263, and the interlayer insulating layer 251. The passivation layer 271 may be formed of a material capable of preventing moisture and impurities from permeating and diffusing through it. For example, the passivation layer 171 may be formed of a silicon nitride (SiNx) layer. The passivation layer 271 may have a thickness of about 6000 Å to about 10 μm. When the thickness of the passivation layer 271 is lower than 6000 Å, permeation and diffusion of moisture and impurities via pin holes may occur. When a thickness of the passivation layer 271 is greater than 10 μm, patterning of the passivation layer 271 may be difficult.

A planarization layer 281 is disposed on the passivation layer 271, and a scintillator layer 290 is disposed on the planarization layer 281. The scintillator layer 290 may be formed of, for example, a cesium-iodide compound.

According to embodiments of the present invention, a region of the interlayer insulating layer 151 or 251 directly contacting the PIN diode is formed of an insulating layer capable of effectively preventing leakage current, and the rest of the interlayer insulating layer 151 or 251 is formed of an insulating layer capable of preventing leakage current to some extent and having barrier characteristics. In addition, the passivation layer 171 or 271, which is the uppermost insulating layer of the X-ray detector panel, is formed of an insulating layer having good barrier characteristics. For example, the region of the interlayer insulating layer 151 or 251 directly contacting the PIN diode may be formed of an insulating layer having a band gap energy of about 8 eV to about 10 eV, and the rest of the interlayer insulating layer 151 or 251 may be formed of an insulating layer having a band gap energy of about 3 eV to about 10 eV. The passivation layer 171 or 271 may be formed of an insulating layer having a band gap energy of about 3 eV to about 7 eV.

As described above, in the X-ray detector panel according to embodiments of the present invention, an insulating layer capable of effectively preventing leakage current and having a relatively large band gap energy is used in the region of the interlayer insulating layer 151 or 251 directly contacting the PIN diode. An insulating layer capable of preventing leakage current to some extent and having good barrier characteristics is used in the rest of the interlayer insulating layer 151 or 251. Moreover, an insulating layer having good barrier characteristics is used in the passivation layer 171 or 271. Thus, moisture permeation into the photodiode may be effectively prevented, and fine leakage current may be suppressed at the interfaces of the photodiode.

While the present invention has been particularly shown and described with reference to exemplary embodiments thereof, it will be understood by those of ordinary skill in the art that various changes in form and detail may be made therein without departing from the spirit and scope of the present invention as defined by the following claims.

What is claimed is:

1. An X-ray detector panel, comprising:
a substrate;
a transistor including a gate electrode disposed on the substrate, a gate insulating layer disposed on the gate electrode, an active layer disposed on the gate insulating layer, and a source electrode and a drain electrode disposed on the active layer and separated from each other;
a photodiode including a first electrode connected to the drain electrode of the transistor, a photoconductive layer disposed on the first electrode, and a second electrode disposed on the photoconductive layer;
an interlayer insulating layer including a first interlayer insulating layer covering the transistor and the photodiode, the first interlayer insulating layer being formed of an insulating material having a band gap energy in a range of about 8 eV to about 10 eV;
a data line disposed on the interlayer insulating layer and contacting the source electrode of the transistor via the interlayer insulating layer;
a bias line disposed on the interlayer insulating layer and contacting the second electrode of the photodiode via the interlayer insulating layer; and
a passivation layer disposed on the data line, the bias line, and the interlayer insulating layer;
the interlayer insulating layer further comprising a second interlayer insulating layer disposed on the first interlayer insulating layer, the second interlayer insulating layer being formed of an insulating material having a band gap energy in a range of about 3 eV to about 10 eV.

2. The X-ray detector panel of claim 1, wherein the interlayer insulating layer has a thickness in a range of about 6000 Å to about 10μm.

3. The X-ray detector panel of claim 1, wherein the first interlayer insulating layer has a thickness in a range of about 300 Å to about 1000Å.

4. The X-ray detector panel of claim 1, wherein the insulating material of the first interlayer insulating layer comprises a silicon oxide (SiOx) layer.

5. The X-ray detector panel of claim 1, wherein the insulating material of the second interlayer insulating layer comprises a silicon oxynitride (SiONx) layer.

6. The X-ray detector panel of claim 1, wherein the passivation layer comprises a silicon nitride (SiNx) layer.

7. The X-ray detector panel of claim 1, further comprising a planarization layer disposed on the passivation layer.

8. The X-ray detector panel of claim 7, further comprising a scintillator layer disposed on the planarization layer.

9. The X-ray detector panel of claim 1, wherein the first electrode of the photodiode extends from the drain electrode of the transistor.

10. The X-ray detector panel of claim 1, wherein the photodiode comprises a PIN diode.

11. The X-ray detector panel of claim 1, further comprising an ohmic contact layer disposed between the active layer and each of the source electrode and the drain electrode.

12. An X-ray detector panel, comprising:
a substrate;
a transistor including a gate electrode disposed on the substrate, a gate insulating layer disposed on the gate electrode, an active layer disposed on the gate insulating layer, and a source electrode and a drain electrode disposed on the active layer and separated from each other;
a photodiode including a first electrode which includes a lower layer and an upper layer disposed on the lower layer, a photoconductive layer disposed on the upper layer of the first electrode, and a second electrode disposed on the photoconductive layer;
a capping layer covering the transistor;
an interlayer insulating layer including a first interlayer insulating layer covering the capping layer and the photodiode, the first interlayer insulating layer being formed of an insulating material having a band gap energy in a range of about 8 eV to about 10 eV;
a data line disposed on the interlayer insulating layer and contacting the source electrode of the transistor via the interlayer insulating layer and the capping layer;
a bias line disposed on the interlayer insulating layer and contacting the second electrode of the photodiode via the interlayer insulating layer; and
a passivation layer disposed on the data line, the bias line, and the interlayer insulating layer;
the interlayer insulating layer further comprising a second interlayer insulating layer disposed on the first interlayer insulating layer, the second interlayer insulating layer being formed of an insulating material having a band gap energy in a range of about 3 eV to about 10 eV.

13. The X-ray detector panel of claim 12, wherein the interlayer insulating layer has a thickness in a range of about 6000 Å to about 10μm.

14. The X-ray detector panel of claim 12, wherein the first interlayer insulating layer has a thickness in a range of about 300 Å to about 1000Å.

15. The X-ray detector panel of claim 12, wherein the insulating material of the first interlayer insulating layer comprises a silicon oxide (SiOx) layer.

16. The X-ray detector panel of claim 12, wherein the insulating material of the second interlayer insulating layer comprises a silicon oxynitride (SiONx) layer.

17. The X-ray detector panel of claim 12, wherein the passivation layer comprises a silicon nitride (SiNx) layer.

18. The X-ray detector panel of claim 12, wherein the photodiode comprises a PIN diode.

* * * * *